(12) United States Patent
Nielson et al.

(10) Patent No.: US 9,029,681 B1
(45) Date of Patent: May 12, 2015

(54) MICROSYSTEM ENABLED PHOTOVOLTAIC MODULES AND SYSTEMS

(75) Inventors: Gregory N. Nielson, Albuquerque, NM (US); William C. Sweatt, Albuquerque, NM (US); Murat Okandan, Edgewood, NM (US)

(73) Assignee: Sandia Corporation, Albuquerque, NM (US)

( * ) Notice: Subject to any disclaimer, the term of this patent is extended or adjusted under 35 U.S.C. 154(b) by 705 days.

(21) Appl. No.: 12/914,441

(22) Filed: Oct. 28, 2010

(51) Int. Cl.
*H01L 31/042* (2014.01)
*H01L 31/00* (2006.01)
*H01L 31/054* (2014.01)
*F24J 2/06* (2006.01)

(52) U.S. Cl.
CPC ............... *H01L 31/054* (2014.12); *F24J 2/06* (2013.01); *Y02E 10/52* (2013.01)

(58) Field of Classification Search
CPC ...... H01L 31/0522; H01L 31/054; F24J 2/06; Y02E 10/52
USPC .................................................. 136/246, 259
See application file for complete search history.

(56) References Cited

U.S. PATENT DOCUMENTS

| | | | | |
|---|---|---|---|---|
| 4,367,403 A | * | 1/1983 | Miller | 250/203.4 |
| 4,456,783 A | * | 6/1984 | Baker | 136/246 |
| 5,394,272 A | * | 2/1995 | Kvamme et al. | 359/744 |
| 5,482,568 A | | 1/1996 | Hockaday | |
| 5,501,893 A | | 3/1996 | Laermer et al. | |
| 5,632,823 A | * | 5/1997 | Sharan | 136/246 |
| 6,084,173 A | * | 7/2000 | DiMatteo | 136/201 |
| 6,612,705 B1 | | 9/2003 | Davidson et al. | |
| 6,624,548 B1 | | 9/2003 | Miller et al. | |
| 6,804,062 B2 | * | 10/2004 | Atwater et al. | 359/626 |
| 6,957,894 B2 | | 10/2005 | Rabinowitz et al. | |
| 6,964,486 B2 | | 11/2005 | Rabinowitz | |
| 6,987,604 B2 | | 1/2006 | Rabinowitz et al. | |
| 6,988,809 B2 | | 1/2006 | Rabinowitz | |
| 7,077,361 B1 | | 7/2006 | Rabinowitz | |
| 7,172,789 B2 | | 2/2007 | Smith et al. | |
| 7,244,326 B2 | | 7/2007 | Craig et al. | |

(Continued)

OTHER PUBLICATIONS

Zhuxi, Fu, "Resonant Cavity Enhanced Photodetectors", 1999, Department of Physics, University of Science and Technology of China, Hefei\230026)—English language abstract.*

(Continued)

*Primary Examiner* — Tamir Ayad
(74) *Attorney, Agent, or Firm* — Martin I. Finston

(57) ABSTRACT

A microsystem enabled photovoltaic (MEPV) module including: an absorber layer; a fixed optic layer coupled to the absorber layer; a translatable optic layer; a translation stage coupled between the fixed and translatable optic layers; and a motion processor electrically coupled to the translation stage to controls motion of the translatable optic layer relative to the fixed optic layer. The absorber layer includes an array of photovoltaic (PV) elements. The fixed optic layer includes an array of quasi-collimating (QC) micro-optical elements designed and arranged to couple incident radiation from an intermediate image formed by the translatable optic layer into one of the PV elements such that it is quasi-collimated. The translatable optic layer includes an array of focusing micro-optical elements corresponding to the QC micro-optical element array. Each focusing micro-optical element is designed to produce a quasi-telecentric intermediate image from substantially collimated radiation incident within a predetermined field of view.

24 Claims, 8 Drawing Sheets

(56) References Cited

U.S. PATENT DOCUMENTS

| | | | |
|---|---|---|---|
| 7,251,882 B2 | 8/2007 | Ricks et al. | |
| 7,381,886 B1* | 6/2008 | Aiken et al. | 136/246 |
| 2007/0102037 A1* | 5/2007 | Irwin | 136/246 |

OTHER PUBLICATIONS

R. A. Sinton, et al., "Silicon Point Contact Concentrator Solar Cells," IEEE Electron Device Letters. vol. EDL-6, No. 8, Aug. 1985, pp. 405-407.

R. A. Sinton, et al, "Design Criteria for Si Point-Contact Concentrator Solar Cells," IEEE Transactions on Electron Devices, vol. ED-34, No. 10, Oct. 1987, pp. 2116-2123.

Uthara Srinivasan, et al., "Microstructure to Substrate Self-Assembly Using Capillary Forces" Journal of Mioroelectromechanical Systems, vol. 10, No. 1, Mar. 2001, pp. 17-24.

WC Sweatt, et al., "Micro-optics for high-efficiency optical performance and simplified tracking for concentrated photovoltaics (CPV)," Conference Paper, International Optical Design Conference (IODC), Jackson Hole, WY, Jun. 13, 2010.

* cited by examiner

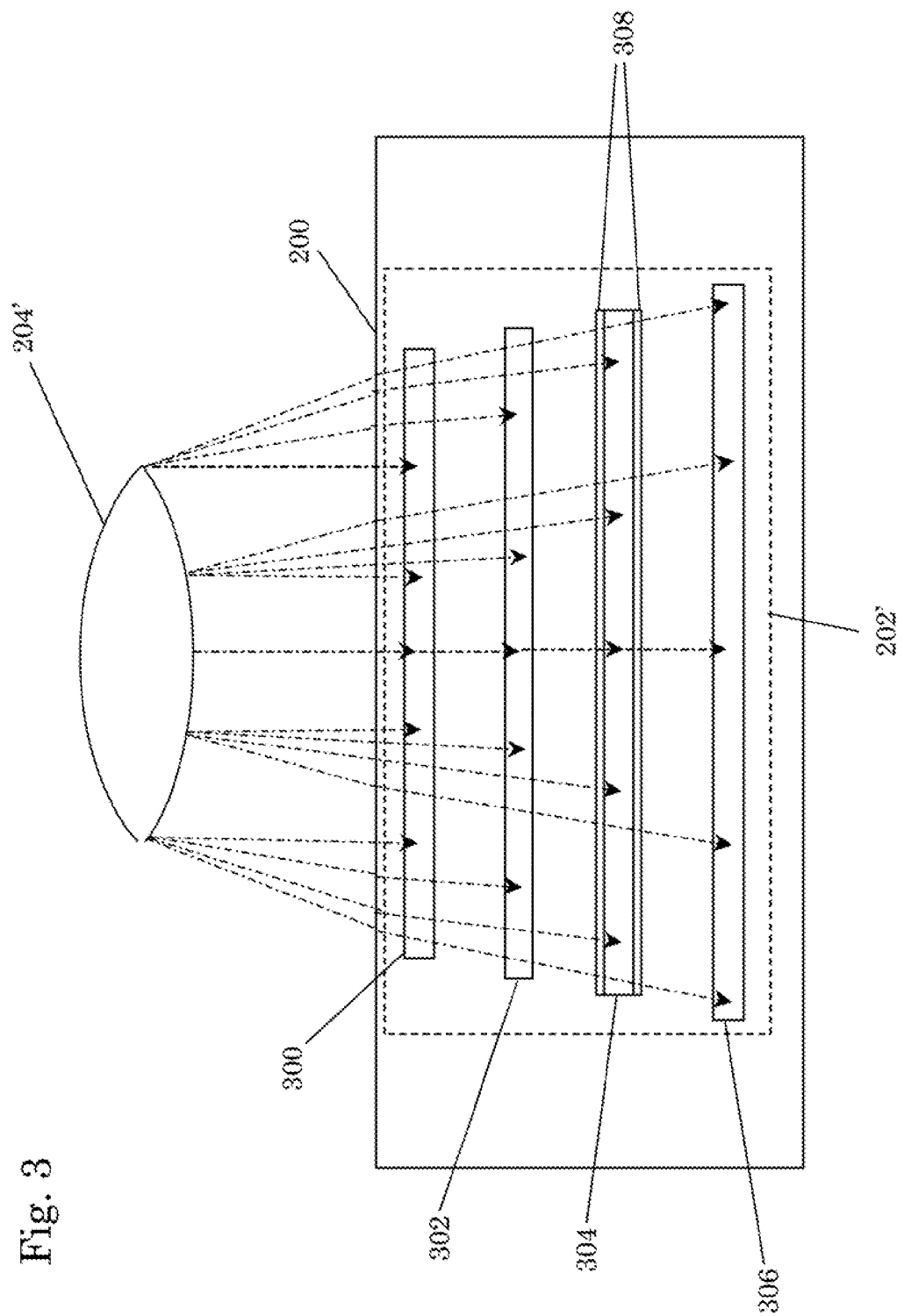

MICROSYSTEM ENABLED PHOTOVOLTAIC MODULES AND SYSTEMS

This invention was developed under Contract DE-AC04-94AL85000 between Sandia Corporation and the US. Department of Energy. The U.S. Government has certain rights in this invention.

CROSS-REFERENCE

Some or all of the subject matter of this application is related to application Ser. No. 11/933,458, titled PHOTOVOLTAIC SOLAR CONCENTRATOR, filed on Nov. 1, 2007, which is hereby incorporated by reference in its entirety.

TECHNICAL FIELD

The present invention is directed generally to photovoltaic systems, and, more particularly, to microsystem enabled photovoltaic solar energy modules and systems with integral micro-optics.

BACKGROUND OF THE INVENTION

The adoption of photovoltaics for generating electricity from sunlight is largely driven by cost considerations. At present, photovoltaic systems are not competitive with fossil fuel generated electricity. Thus, there is a need to reduce the overall photovoltaic system cost. This entails reducing the cost of photovoltaic modules as well as module assembly costs.

The present invention addresses this need with a photovoltaic solar concentrator which utilizes thin, small-area photovoltaic solar cells which can be batch fabricated and assembled onto a low-cost stainless steel or polymer substrate using fluidic self-assembly technology. Sunlight can be concentrated onto the photovoltaic solar concentrator to generate electricity using a moveable lens assembly which utilizes relatively small displacements on the order of millimeters or less to track the sun and thereby increase the efficiency of electrical generation.

These and other advantages of the present invention will become evident to those skilled in the art.

SUMMARY OF THE INVENTION

An exemplary embodiment of the present invention is a microsystem enabled photovoltaic (MEPV) module including: an absorber layer having a top surface a fixed optic layer coupled to the top surface of the absorber layer, a translatable optic layer, a translation stage coupled between the fixed optic layer and the translatable optic layer, and a motion processor electrically coupled to the translation stage. The absorber layer includes an array of photovoltaic (PV) elements. The fixed optic layer includes an array of quasi-collimating (QC) micro-optical elements. Each QC micro-optical element is designed and arranged to couple incident radiation from a quasi-telecentric intermediate image formed by the translatable optic layer into one of the array of PV elements such that the coupled radiation is quasi-collimated. The translatable optic layer includes an array of focusing micro-optical elements. Each focusing micro-optical element corresponds to one of the array of QC micro-optical elements, and is designed to produce a quasi-telecentric intermediate image from substantially collimated radiation incident within a predetermined field of view. The motion processor controls motion of the translatable optic layer relative to the fixed optic layer.

Another exemplary embodiment of the present invention is a PV module adapted to accept incident radiation over a predetermined field of view. The PV element includes an absorber layer and an optic layer coupled to the absorber layer. The absorber layer includes an array of PV elements. Each PV element has a top surface and a predetermined absorption wavelength band. The optic layer includes a close-packed array of Keplerian telescope elements and an array of pupil elements. Each Keplerian telescope element corresponds to one of the array of pupil elements and an objective surface, and each pupil element corresponds to one of the array of PV elements of the absorber layer. The Keplerian telescope elements are designed and arranged to substantially couple radiation that is incident on their objective surfaces, within the predetermined absorption wavelength band, and within the predetermined field of view into the corresponding pupil element Each pupil element is designed and arranged to substantially relay radiation that is coupled into it from the corresponding Keplerian telescope element and within the predetermined absorption wavelength band into the corresponding PV element.

A further exemplary embodiment of the present invention is a PV solar energy system including: a system mount; at least one panel base coupled to the system mount; and at least one optically enhanced PV module coupled to each panel base. The system mount includes at least one right-ascension tilt stage and at least one tilt stage coarse controller coupled to the at least one right-ascension tilt stage to provide coarse right-ascension tracking of the sun each day. One panel base is coupled to each right-ascension tilt stage. Each optically enhanced PV module includes an absorber layer and an optic layer coupled to the absorber layer. The absorber layer has a top surface and a predetermined absorption wavelength band, and includes an array of PV elements. The optic layer includes a close-packed array of micro-optical elements having a one-to-one correspondence to the array of PV elements of the absorber layer. Each of the micro-optical elements has an objective surface and an optical axis substantially normal to the top surface of the absorber layer. The micro-optical elements are each designed and arranged to couple a portion of the radiation that is incident on the objective surface into the corresponding PV element. The coupled portion of the incident radiation is within the predetermined absorption wavelength band and is propagating in a direction within a predetermined field of view of the micro-optical element.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 3 is a side plan drawing of an exemplary PV module with multi-cell PV elements that may be used in exemplary embodiments of the present invention;

DETAILED DESCRIPTION OF THE INVENTION

Figure 1A:
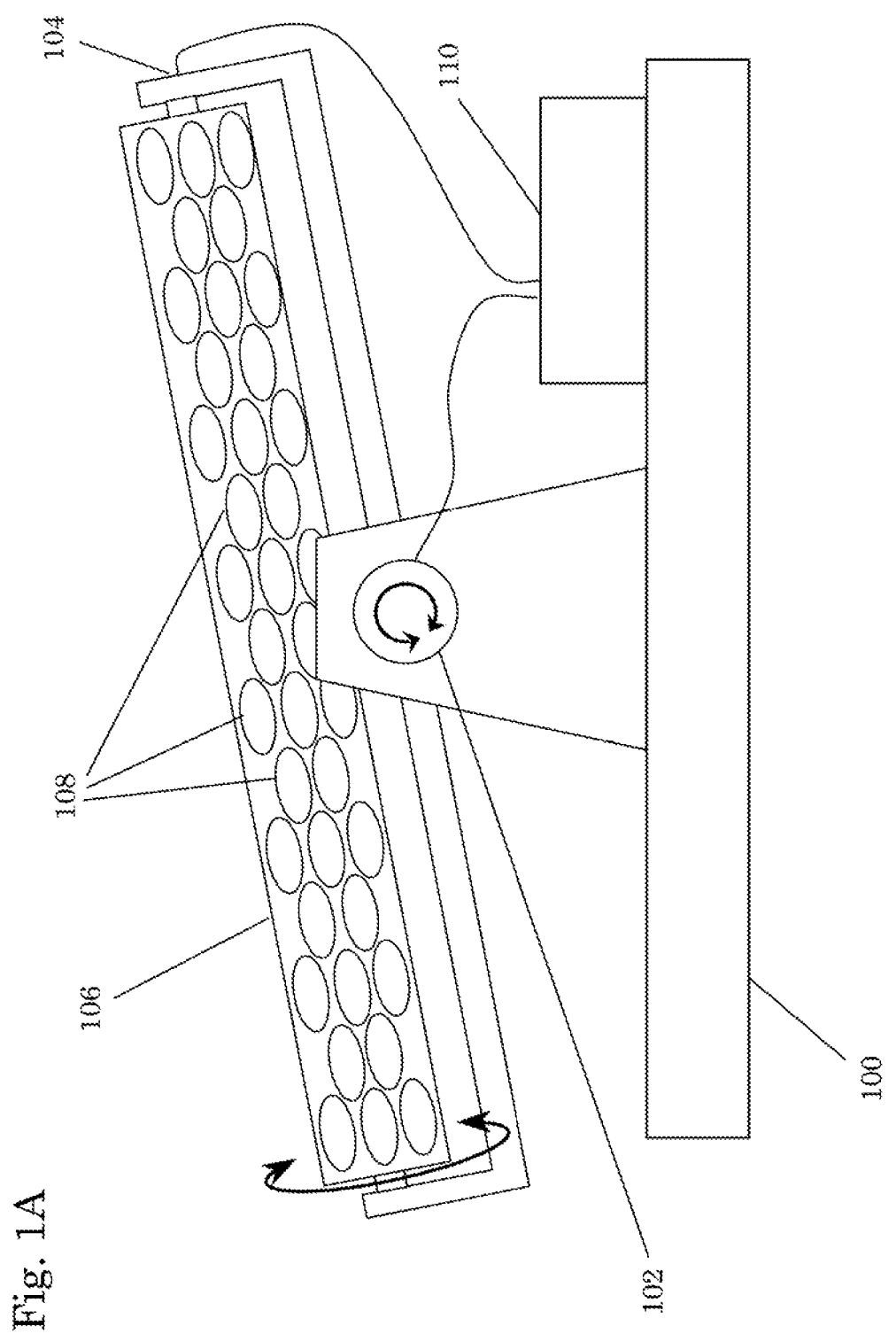
FIG. 1A is a side plan drawing of an exemplary photovoltaic (PV) solar energy system according to the present invention.
Figure 1B:
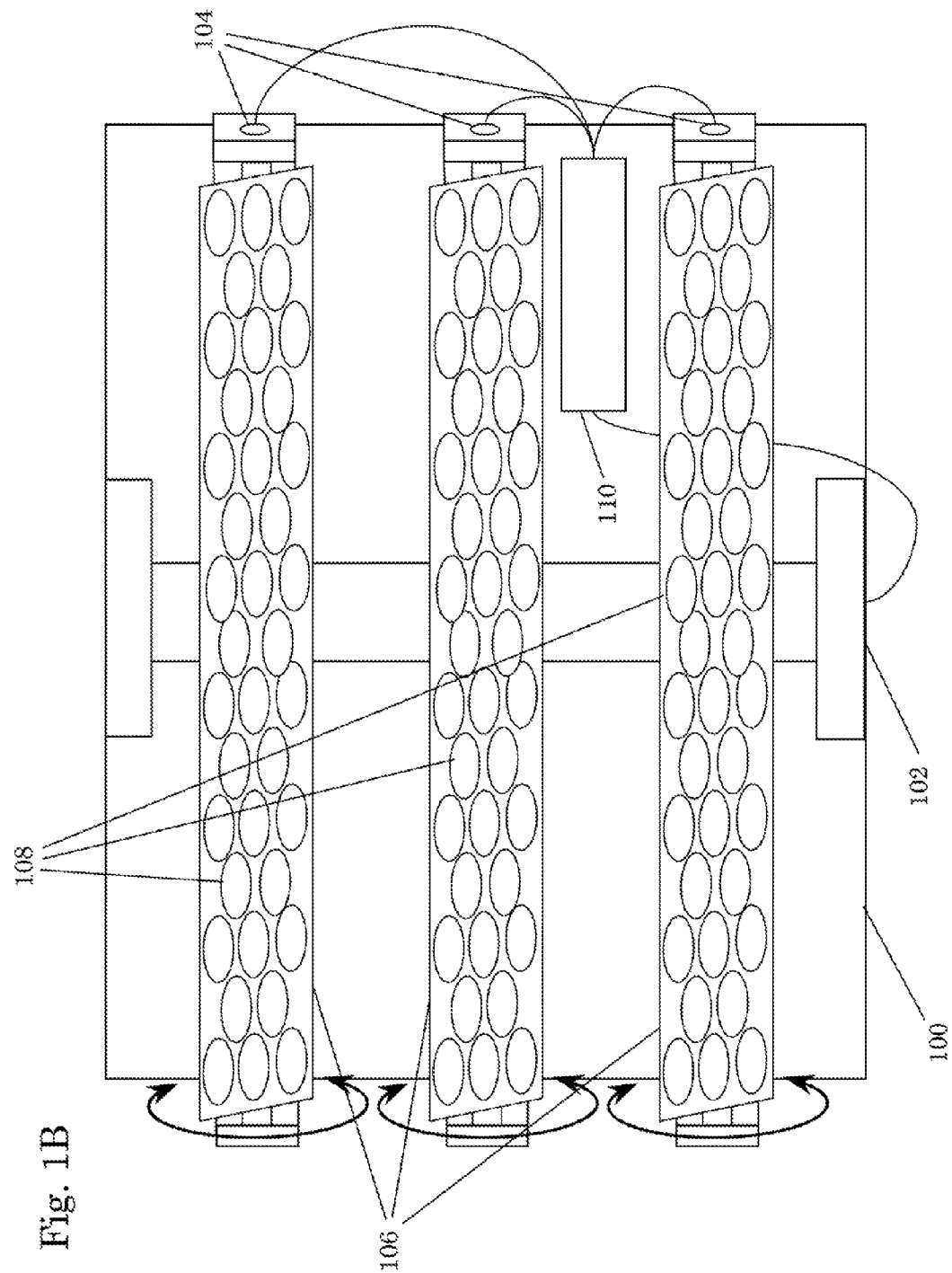
FIG. 1B is a top plan drawing of the exemplary PV solar energy system of FIG. 1A.

Exemplary embodiments of the present invention include photovoltaic (PV) solar energy systems that include PV modules that include micro-optical elements to provide for accurate solar tracking. FIGS. 1A and 1B illustrate an exemplary PV solar energy system according to the present invention. FIG. 1A illustrates the exemplary system from a side view and FIG. 1B illustrates the same exemplary system from above.

The exemplary PV modules used in exemplary PV solar energy system according to the present invention include arrays of individual PV elements. The use of individual PV elements in these exemplary PV modules may help to improve the efficiency and thermal management of the exemplary PV solar energy systems.

The dimensions of the exemplary micro-optical elements are affected based on the desired size of the PV elements, but are desirably tiled to cover the surface area of the exemplary PV modules as efficiently as possible, typically using either a square or hexagonal close-packing scheme. It is also noted that the thickness of the optical layer(s) including the micro-optical arrays is typically proportional to the width of the micro-optical elements (roughly 2.5 to 3 times the lens diameter in many cases) and, thus, the weight of the exemplary PV module. Therefore, to reduce the overall weight of the exemplary PV solar energy system, it may be desirable to reduce the dimensions of the individual micro-optical elements as much as practical. Based on these considerations, a lens size width (diameter for circular lenses) of about 1 mm to 1 cm may be desirable, with 3 mm being typical; however it is contemplated that other dimensions may be desirable in some applications. The weight of such an exemplary system may be a few kilograms per meter squared.

The exemplary PV solar energy system of FIGS. 1A and 1B includes: a system mount; panel bases 106 coupled to the system mount, and optically enhanced PV modules 108 coupled to panel bases 106. The system mount includes: base 100; declination tilt stage 102 coupled to base 100; right-ascension tilt stages 104 coupled to declination tilt stage 102; and a tilt stage coarse controller that includes drive electronics 110 which is mounted on base 100 and electrically coupled to tilt drivers mounted in declination tilt stage 102 and right-ascension tilt stages 104.

It is noted that the exemplary PV solar energy system of FIGS. 1A and 1B includes three panel bases 106 each mounted on a separate right-ascension tilt stage 104, and that the right-ascension tilt stages 104 are then mounted on a single declination tilt stage 102; however, this configuration is merely illustrative and is not intended to be limiting. One skilled in the art will understand that many alternative configurations of these tilt stages may be incorporated in exemplary embodiments of the present invention. It is additionally noted that the exemplary PV solar energy system of FIGS. 1A and 1B illustrated only one set of drive electronics to provide control for the tilt drivers mounted in declination tilt stage 102 and all three right-ascension tilt stages 104. This configuration was selected to simplify the illustrations of FIGS. 1A and 1B and is not intended to be limiting.

In exemplary embodiments of the present invention, declination tilt stage 102 and right-ascension tilt stages 104 provide coarse solar alignment of panel bases 106, while precision solar tracking is accomplished using micro-optical elements in individual optically enhanced PV modules 108. Thus, these coarse tilt stages do not need to be particularly accurate, and may be controlled using a number of tilt drive systems such as a dock drive, a stepper motor, or manual adjustment. Manual adjustment may be more desirable for declination tilt stage 102, which may only require adjustment a few times a year, unlike right-ascension tilt stage 104, which not only is used daily to provide coarse solar tracking, but also is anticipated to operate over a larger angular range. It is even contemplated that declination tilt stage 102 may be omitted altogether in situations where the range of acceptable incident angles afforded by the micro-optical elements in sufficiently large.

Additionally, because of the use of micro-optical elements in individual optically enhanced PV modules 108 to provide precise solar tracking, panel bases 106 may be less rigid than in many prior-art solar panel applications. Thus, panel bases 106 may be constructed from lighter and less expensive materials, including various plastics and sheet metals.

The exemplary PV solar energy system of FIGS. 1A and 1B includes multiple optically enhanced PV modules mounted on each panel base 106. These exemplary optically enhanced PV modules include an absorber layer and an optic layer coupled to the absorber layer. The absorber layer is desirably formed of semiconductor material, using standard semiconductor fabrication techniques, and the optic layer is desirably formed of a plastic material that has been shaped by molding, or possibly milled using diamond turning or a similar technique. Thus, it may not be desirable to form these two layers monolithically; however, precision registration of these layers is desirable. Therefore, it may be desirable for the absorber layer and the optic layer to be mechanically snapped together.

Both the optic layer and the absorber layer of exemplary optically enhanced PV modules may include a number of sub-layers.

The absorber layer includes an array of PV elements that have a predetermined absorption wavelength band. This absorption wavelength band may desirably be about 400 nm to 1400 nm, as this covers the majority of the solar energy band.

The optic layer includes a close-packed array of micro-optical elements that have a one-to-one correspondence to the array of PV elements of the absorber layer. This close-packed array of micro-optical elements may be a close-packed hexagonal array or a close-packed square array. It may be desirable for the micro-optical elements to have a circular cross-section; however it is noted that the micro-optical elements may by hexagonal or square to tile the entire surface of the optic layer. In addition to the role of these micro-optical elements in increasing the field of view over which the PV elements are able to efficiently absorb incident radiation, the micro-optical elements also serve to increase the intensity of the incident radiation within the PV elements. Although this increased intensity may not be necessary for many direct bandgap PV absorption materials, it may be desirable for other PV absorption materials, such as Si. A solar concentration of about 25× to about 200× may be desirable, with about 49× (a magnification of 7×) being typical. This magnification may desirably increase the inherent efficiency of most PV absorption materials and may dramatically reduce the amount of PV material needed as compared with a typical flat panel solar panel.

Micro-optical elements used in exemplary embodiments of the present invention may typically be refractive lenses or trains of lenses; however, it is contemplated that exemplary micro-optical elements may also include diffractive or reflective optical elements. A refractive micro-optical element may include a lens with curved surfaces and/or an index gradient.

It is noted that, although there is a one-to-one correspondence between the close-packed array of micro-optical elements of the optic layer and the array of PV elements of the absorber layer, the array of PV elements may not be close-packed in a number of exemplary embodiments. It is also noted that it may be desirable for the PV elements to have a circular cross-section. As noted above, the use of individual PV elements may have the combined advantages of improved thermal management and increased efficiency.

Exemplary micro-optical elements of the optic layer desirably share several features. Each exemplary micro-optical element has an objective surface and an optical axis substantially normal to the top surface of the absorber layer. Each exemplary micro-optical element is also designed and arranged to couple a portion of radiation that is incident on its objective surface into the corresponding PV element. This portion of the incident radiation is that portion that has a wavelength within the predetermined absorption wavelength band of the PV elements of the absorber layer and is traveling in a direction within a predetermined range of right-ascension and a predetermined range of declination measured from the optical axis of the micro-optical element (i.e. the predetermined field of view). Although the range of right-ascension and the range of declination of an exemplary micro-optical element are often desirably the same angular range, it is contemplated that these ranges may be different in some exemplary embodiments of the present invention. In particular, an exemplary micro-optical element may have a smaller range of declination without significantly affecting its performance. This is due to smaller range and slower rate of change of the declination of the sun. These ranges may desirably be a large as about −14° to about 14° (i.e. a field of view of +/−14°).

Figure 2:
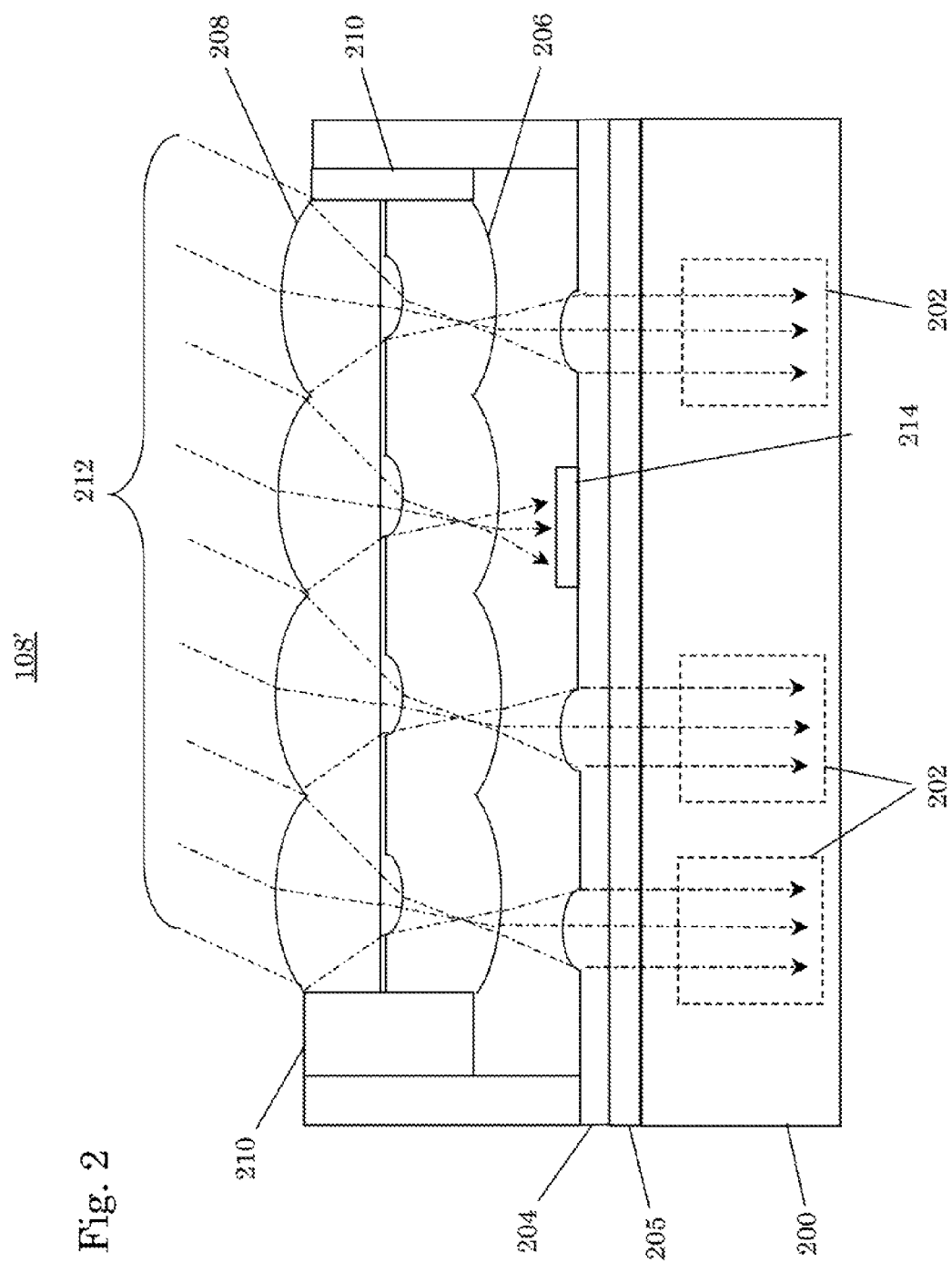
FIG. 2 is a side plan drawing of an exemplary microsystem enabled PV (MEPV) module according to the present invention.

FIGS. 2, 3, and 4 illustrate various exemplary optically enhanced PV modules, and features thereof, that may used in exemplary PV solar energy systems according to the present invention, such as the exemplary system of FIGS. 1A and 1B.

FIG. 2 illustrates exemplary microsystem enabled PV (MEPV) module 108' including absorber layer 200 and a microsystem enabled optic layer. Absorber layer 200 includes an array of PV elements 202. PV elements 202 may be any type of PV element known to those skilled in the art, including PV elements having one or more semiconductor p-n or p-i-n junctions. Alternatively, PV element 202 may be an exemplary stacked-cell PV element, such as the exemplary stacked-cell PV element 202' illustrated in FIG. 3. Absorber layer 200 may also desirably include wide bandwidth anti-reflection (AR) coating 205.

The microsystem enabled optic layer includes: fixed optic layer 204 coupled to the top surface of absorber layer 200; a translatable optic layer formed of first translatable optic sub-layer 206 and second translatable optic sub-layer 208; translation stage 210 coupled between fixed optic layer 204 and the translatable optic layer, and a motion processor electrically coupled to the translation stage to control motion of the translatable optic layer relative to the fixed optic layer. The motion processor is not illustrated in exemplary embodiment of FIG. 2; however one skilled in the art may understand that the circuitry of the motion processor may be monolithically integrated in the absorber layer during its fabrication, or the motion processor may be included as a separate processor element.

Fixed optic layer 204 is desirably formed of a plastic material having a moderately high Abbe number implying a low chromatic dispersion similar to that of crown glass, such as poly(methyl methacrylate) (PMMA), or may be formed of crown glass, and may desirably be designed to mechanically snap onto absorber layer 200. In an alternative embodiment, fixed optic layer 204 may be monolithically formed on the top surface of absorption layer 200 and may function as immersion lenses. This monolithic optic layer may be formed from various dielectric materials during semiconductor fabrication, or may be formed from a photoresist material. It is also contemplated that fixed optics layer 204 may include both immersion micro-optic elements in a monolithic sub-layer and common micro-optic elements in a separate fixed optic sub-layer.

As illustrated by incident rays 212 in FIG. 2, first translatable optic sub-layer 206 and second translatable optic sub-layer 208 are designed form an array of focusing micro-optical elements. In an exemplary embodiment of the present invention, first translatable optic sub-layer 206 is formed of a plastic material that has a moderately low Abbe number similar to flint glass (e.g., polycarbonate), or flint glass, and second, translatable optic sub-layer 208 is formed of a plastic material that has a high Abbe number similar to crown glass (e.g., PMMA), or crown glass. To provide for the desired registration between translatable optic sub-layers 206 and 208, these sub layers may be designed to mechanically snap together.

In the exemplary embodiment of FIG. 2, it is noted that two sub-layers are used to form the array of focusing micro-optical elements; however, it is contemplated that other approaches to forming the focusing micro-optical elements may be used.

Each focusing micro-optical element transforms the angle of incidence of radiation incident on its surface into a linear displacement in the plane normal to its optical axis, for angles within the field of view of the focusing micro-optical element. This allows each focusing micro-optical element to produce, from the incident solar radiation, a quasi-telecentric intermediate image of the sun above the top surface of the fixed optic, when the sun is within the predetermined field of view. In an exemplary embodiment of the present invention, this field of view may desirably be in the range of about −14° to about 14°. Thus, each focusing micro-optical element creates a telecentric image of the sun for a range of field angles.

These focusing micro-optical elements of the translatable optic layer may desirably be two dimensional lenses designed to be telecentric for incident radiation over a range of angles from a normal to the top surface of absorber layer 200, i.e. the field of view. In exemplary embodiments including this feature, translation stage 210 desirably provides translation in both dimensions of a plane substantially parallel to the top surface of absorber layer 200.

It is contemplated that two dimensional telecentric lenses designed for different ranges of angles for angles of right-ascension and angles of declination may be used in exemplary embodiments of the present invention. The focusing micro-optical elements may even be one dimensional telecentric lenses designed to be telecentric for incident radiation over the telecentric range of angles in only one plane perpendicular to the top surface of absorber layer 200. In exemplary embodiments including this feature, translation stage 210 desirably provides translation only in the telecentric plane and the array of one dimensional telecentric lenses of the translatable layer and translation stage 210 are desirably aligned to allow the MEPV module to provide precision right-ascension solar tracking. A separate method for maintaining the desired declination may be necessary in this exemplary embodiment.

In the exemplary embodiment of FIG. 2, each focusing micro-optical element of the translatable optic layer is designed such that substantially collimated incident radiation (such a solar radiation) is transmitted to form a quasi-telecentric intermediate image just above the top surface of the fixed optic. Each of these focusing micro-optical elements corresponds to a quasi-collimating (QC) micro-optical element in fixed optic layer 204, which is designed to couple incident radiation from this quasi-telecentric intermediate image into one of the array of PV elements such that the coupled radiation is normal to the surface of the PV cell to within about 3°. Because each focusing micro-optical element transforms an angle of incidence into a linear displacement, as the angle of incidence of the solar radiation varies, translation stage 210 can be used to maintain the desired alignment of the diverging light cone transmitted from the focusing micro-optical element in the translatable optic layer with the corresponding QC micro-optical element in fixed optic layer 204.

Figure 5A:
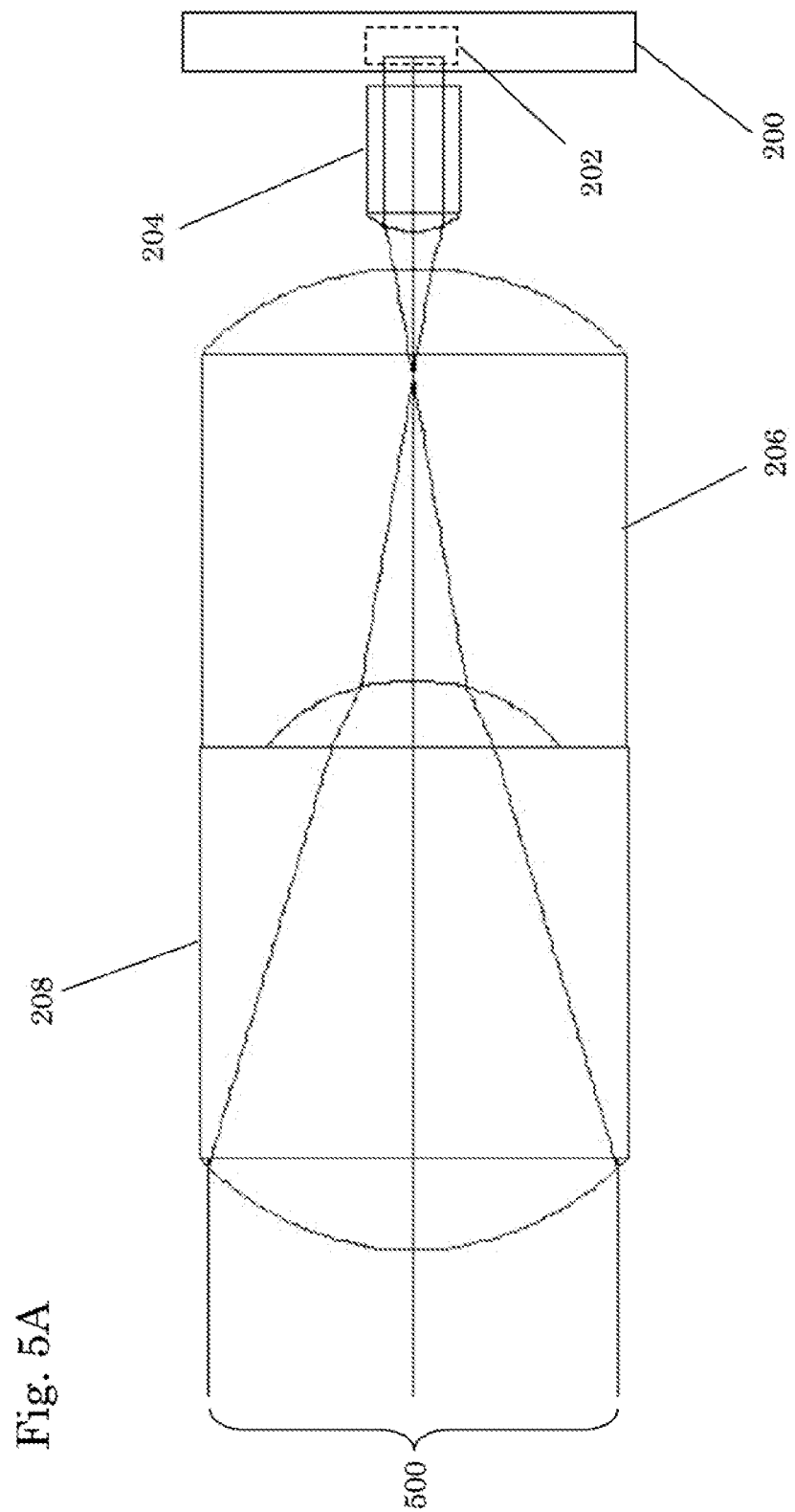
FIGS. 5A and 5B are side plan drawings of an exemplary MEPV module according to the present invention illustrating optical paths for two exemplary angles of incidence.
Figure 5B:
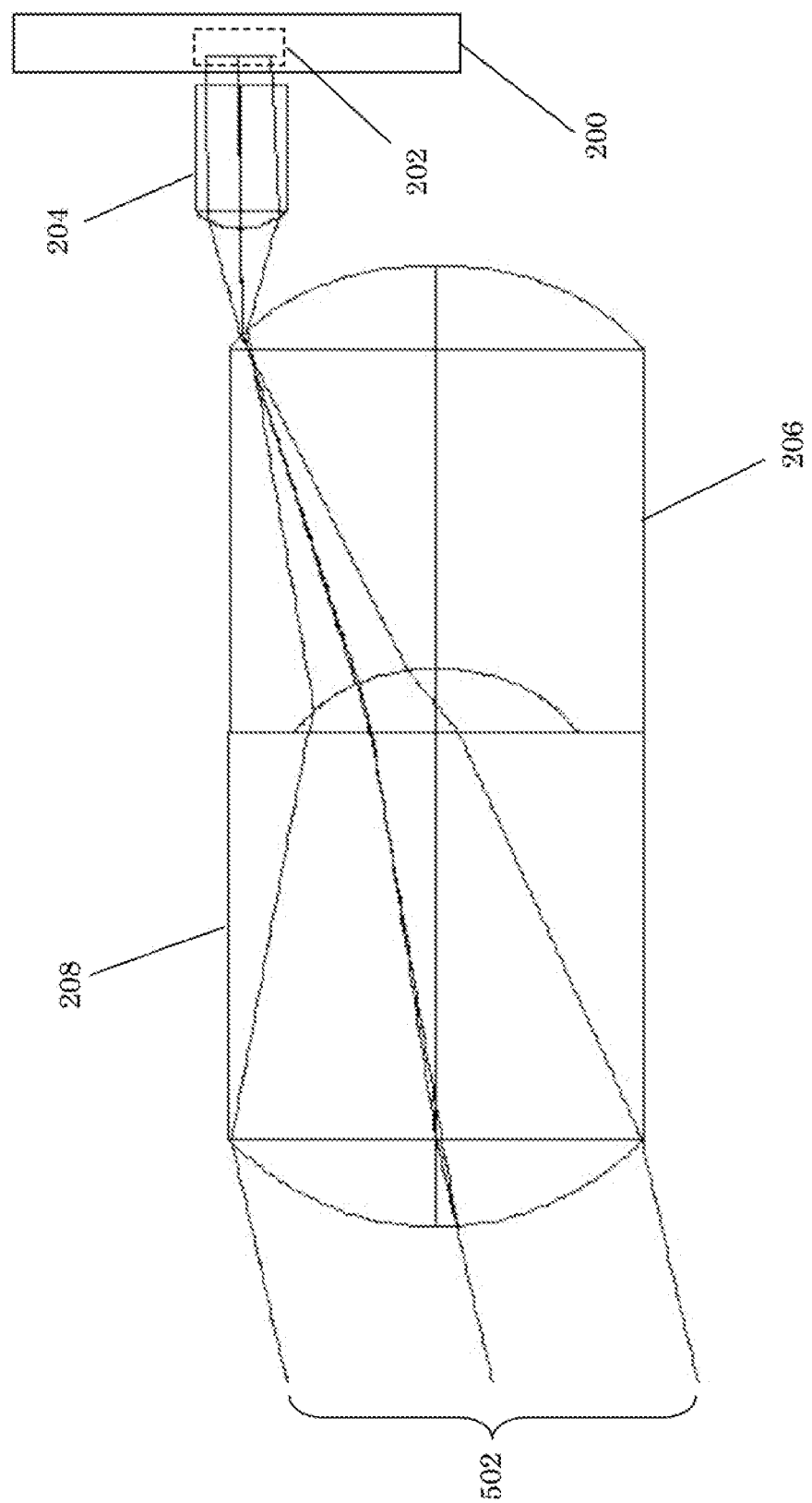

FIGS. 5A and 5B include exemplary ray tracings illustrating the combined operation of fixed layer 204 with the translatable optic layer (translatable optic sub-layers 206 and 208). In FIG. 5A, collimated radiation 500 is incident on the objective micro-optical element of second translatable optic sub-layers 208 parallel to the optical axis of the translatable optic layer (i.e. normal to the top surface of absorber layer 200). Therefore in this example, the translatable optic layer is positioned such that the corresponding QC micro-optical element of fixed optic layer 204 and PV element 202 of absorber layer 200 are aligned with the optical axis of the translatable optical layer). In FIG. 5B, nearly collimated radiation from the sun 502 is incident on the objective micro-optical element of second translatable optic sub-layers 208 at an angle near to the edge of the field of view of the MEPV. Therefore in this example, the translatable optic layer is positioned such that the corresponding QC micro-optical element of fixed optic layer 204 and PV element 202 of absorber layer 200 are aligned near the edge of the translatable optical layer.

Thus, in combination with the QC micro-optic elements of fixed optic layer 204, the telecentric image of the sun created by the focusing micro-optical elements is desirably transmitted into PV cells 202 of absorption layer 200 with a quasi-flat image plane for any field angle (i.e. approximately zero Petzval curvature). The resulting quasi-telecentric image of the sun is desirably telecentric to within an angle of about 3 degrees for the entire predetermined absorption wavelength band and the whole solar tracking range (i.e. the telecentric range of angles). It is noted that it may be desirable for this telecentric image of the sun created by the micro-optical elements to have a minimum of off-axis aberrations (namely, lateral color, astigmatism, and coma), as these off-axis aberrations warp the image delivered to PV cells 202. One skilled in the art will understand that such aberrations may be limited such that the resulting light beams delivered to PV cells 202 are warped by less than about 1% of the entering diameter of the front micro-optical element.

One potential advantage of designing the exemplary micro-optical elements of an exemplary PV module to provide a quasi-flat image throughout the telecentric field of view occurs when wide bandwidth AR coating 205 is including in absorption layer 200. Because the resulting quasi-collimated beams formed by the exemplary micro-optical elements are desirably coupled into absorption layer at approximately normal incidence, this design may both significantly simplify the design and significantly improve the efficiency of wide bandwidth AR coating 205.

Each QC micro-optical element is located above a PV element 202 and delivers a quasi-collimated beam to the corresponding PV element 202. The quasi-collimated beam may desirably couple radiation into the PV element that is within approximately 3° of normal. In an exemplary embodiment, such as exemplary PV element 202', illustrated in FIG. 3, this quasi-collimated beam may be slightly divergent at longer wavelengths by design, to match larger PV cells of PV elements 202 that are designed to absorb longer wavelengths.

Translation stage 210 may desirably be any type of precision motion stage used in micro-mechanical applications, such as, e.g., a piezoelectric motion stage; a microelectromechanical system (MEMS) driven motion stage; an electrostrictive motion stage; a magnetostrictive motion stage; or an inchworm drive motion stage. This precision motion stage may be desirably driven by the motion processor using feedback control to maintain precision alignment of the diverging light cone transmitted from the focusing micro-optical element in the translatable optic layer with the corresponding QC micro-optical element in fixed optic layer 204.

To provide the feedback for this feedback control loop, the motion processor may include at least one beam alignment sensor. The motion processor may then control the motion of the translatable optic layer relative to fixed optic layer 204 based on electrical signals from the beam alignment sensor(s). FIG. 2 illustrates an exemplary placement of beam alignment sensor 214, replacing one QC micro-optical element of fixed optic layer 204. Desirably, beam alignment sensor 214 is designed to detect the desired alignment of the diverging light cones transmitted from the focusing micro-optical elements in the translatable optic layer with the corresponding QC micro-optical elements in fixed optic layer 204. For example, in an exemplary MEPV module in which each focusing micro-optical element of the translatable optic layer is a two dimensional telecentric lens, it may be desirable for beam alignment sensor 214 to be a quad element sensor.

Alternatively, at least one PV element of absorber layer 200 may be electrically coupled to the motion processor to provide the desired feedback. In this exemplary embodiment, the motion processor may control the motion of the translatable optic layer relative to fixed optic layer 204 so as to substantially maximize the power of the electrical signal received from the coupled PV element(s).

FIG. 3 illustrates an exemplary PV module including multi-cell PV element 202' and micro-optical element 204'. It is noted that the exemplary features of FIG. 3 may be incorporated into the exemplary PV modules of the embodiments of FIGS. 1A, 1B, 2, and 4. It is also noted that micro-optical element 204' may incorporate any of the features of the exemplary microsystem enhanced optical elements described above with reference to FIG. 2 or the exemplary Keplerian telescope elements described below with reference to FIG. 4.

As illustrated in FIG. 3, micro-optical element 204' may include a degree of chromatic aberration. Desirably, micro-optical element 204' is designed to substantially collimate incident radiation having a first wavelength, but may transmit longer wavelengths in increasingly divergent cones. FIG. 3 illustrates three such longer wavelengths. The four illustrated wavelengths desirably represent the peak absorption wavelengths of the four PV cells illustrated in exemplary stacked-cell PV element 202'. It is noted that the specific selection of four PV cells in exemplary stacked-cell PV element 202' is merely illustrative and is not intended to be limiting. It will be understood to one skilled in the art that exemplary stacked-cell PV elements using either lesser or greater numbers of stacked-cell PV cell (although at least two are necessary to form a stack) may be used within the scope of the present invention. The specific selection of the number of PV cells in each stacked-cell PV element may be determined based on a number of factors, including but not limited to: the desired wavelength band of the PV module; the desired materials to be used in absorber layer 200; and the maximum acceptable level of fabrication complexity for absorber layer 200.

In this exemplary embodiment, the first PV cell includes a layer of PV cell absorber material 300, which desirably has an absorption wavelength peak approximately equal to the light collimated by micro-optical element 204'. Because the absorption wavelength peak of PV cell absorber material 300 is at the short wavelength end of the wavelength band of stacked-cell PV element 202', longer wavelengths not absorbed by this first PV cell are transmitted deeper into the stacked-cell PV element with minimal loss.

The second PV cell includes a layer of PV cell absorber material 302, which desirably has an absorption wavelength peak longer than the absorption wavelength peak of first PV cell absorber material 300. Again longer wavelengths not absorbed by the second PV cell are transmitted deeper into the stacked-cell PV element with minimal loss.

The third PV cell of stacked-cell PV element 202' includes a Fabry-Perot cavity formed by a pair of reflective layers 308 surrounding PV cell absorber material 304. This Fabry-Perot cavity is designed to be a low-Q cavity with a resonant wavelength longer than the absorption wavelength peak of second PV cell absorber material 302. PV cell absorber material 304 desirably has an absorption wavelength peak that is approximately equal to the resonant wavelength of this Fabry-Perot cavity. Thus, this Fabry-Perot cavity may increase the intensity of the incident radiation having a wavelength near the absorption peak wavelength of PV cell absorber material 304. As noted above, increased intensity may be desirable to improve efficiency for some PV cell absorber materials.

The fourth PV cell includes a layer PV cell absorber material 306. PV cell absorber material 306 desirably has an absorption wavelength peak that is longer than the absorption wavelength peak of first PV cell absorber material 304. Alternatively, it is contemplated that the bottom PV cell of exemplary PV element 202' may include a thermal PV cell to harvest IR light from the sun. Such a design may also have the advantage of harvesting additional energy from unabsorbed shorter wavelength radiation that higher PV cells in exemplary stacked-cell PV element 202' may have failed to absorb.

It is noted that, although the third PV cell in exemplary stacked-cell PV element 202' is illustrated as including a Fabry-Perot cavity formed by reflectors 308, this inclusion is merely illustrative. It is contemplated that exemplary stacked-cell PV cells according to the present invention may omit this Fabry-Perot cavity or may include one or more additional Fabry-Perot cavities surrounding the PV cell absorber material of other PV cells in the stack.

As illustrated in FIG. 3, each of the exemplary PV cells of stacked-cell PV element 202' is centered about a common centerline normal to the top surface of absorber layer 200, and each successive PV cell down from the top surface of absorber layer 200 has a successively larger cross-sectional area in a plane parallel to the top surface of absorber layer 200. This design coupled with the chromatic aberration of micro-optical element 204', allows each successive PV cell to efficiently absorb incident radiation within its absorption band, while using a minimum of the PV cell absorber material. Because of the use of the chromatic aberration of micro-optical element 204' in this exemplary arrangement of the PV cells, it may be desirable for exemplary stacked-cell PV element 202' (and each PV cell within it) to have a substantially circular cross-section in a plane parallel to the top surface of absorber layer 200.

The reduction of PV cell absorber material afforded by this exemplary cell design may be particularly desirable for more expensive high efficiency PV cell absorber materials tuned to shorter wavelengths such as, e.g., type III/V semiconductor materials. It is noted that the use of Fabry-Perot cavities in certain of these exemplary PV cells may also reduce the quantity of PV cell absorber material used in each cell, as well as increasing the radiation intensity near the peak absorption wavelength of the PV cell absorber material, which may be desirable in many types of PV cell absorber material. However, in some PV cell absorber materials, such as Ge used for absorption of infrared wavelengths, such increased radiation intensity may be undesirable (and the material may be less expensive as well).

Exemplary PV cells according to the present invention may include any commonly used PV absorber material. Such materials include a number of type III/V semiconductor materials (e.g., GaN, GaAs, InSb, AlGaAs, GaAsP, AlGaAsP, and InGaP), type II/VI semiconductor materials (e.g., HgCdTe), and type IV semiconductor materials (e.g., Si, Ge, and C). Additionally, the bottom PV cell of an exemplary stacked-cell PV element according to the present invention may be a thermal PV cell. The specific selection of the desired PV cell absorber materials may be determined by the desired wavelength band of the PV module. In the exemplary embodiment of FIG. 3, PV cell absorber material 300 of the first PV cell may be selected to be InGaP (to absorb blue and green light), PV cell absorber material 302 of the second PV cell may be selected to be GaAs (to absorb yellow and red light), PV cell absorber material 304 of the third PV cell may be selected to be Si (to absorb near infrared radiation), and PV cell absorber material 306 of the fourth PV cell may be selected to be Ge (to absorb 1.0-1.6 micron radiation).

Figure 4A:
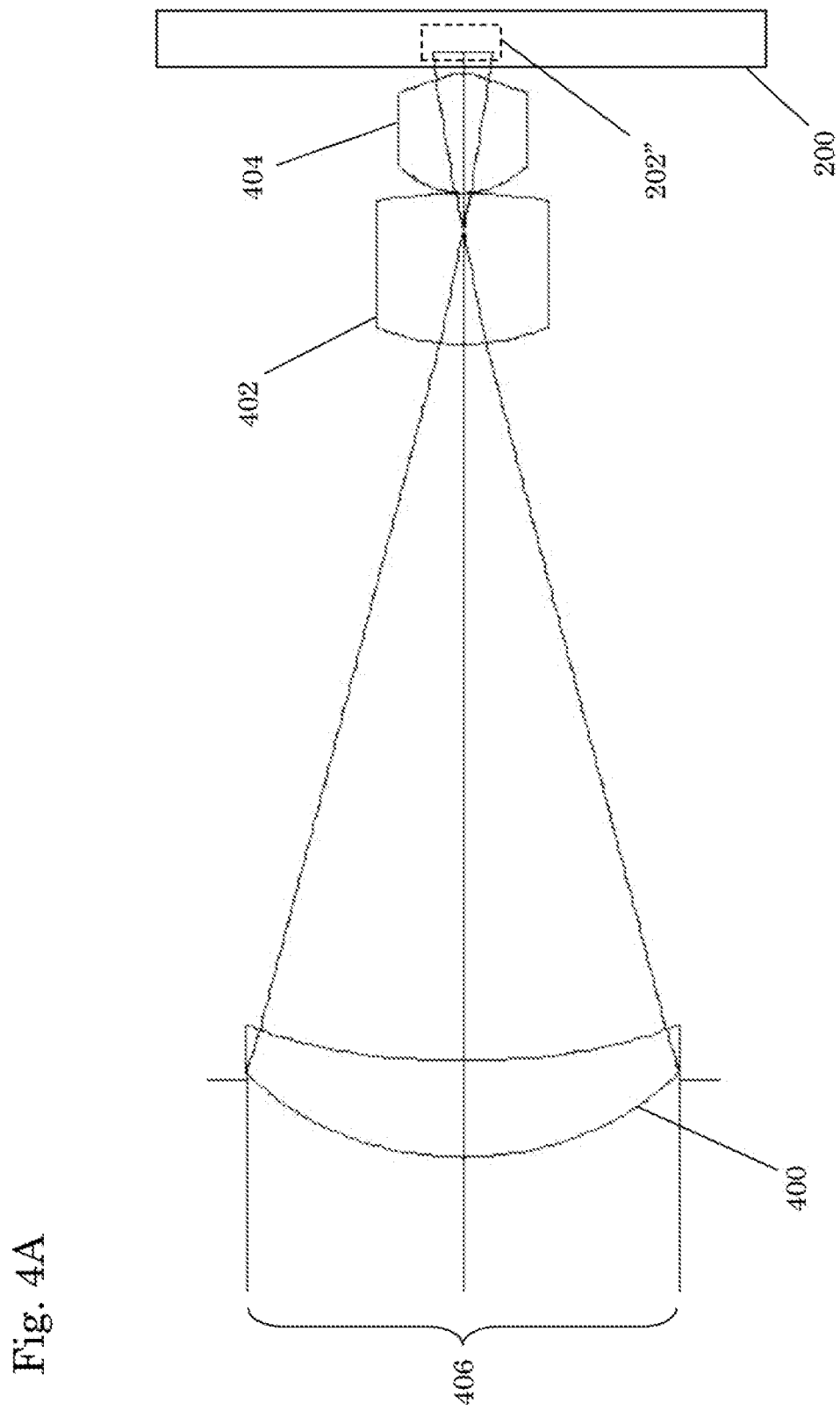
FIGS. 4A and 4B are side plan drawings of an exemplary PV module with an integrated Keplerian telescope optical element according to the present invention illustrating optical paths for two exemplary angles of incidence.
Figure 4B:
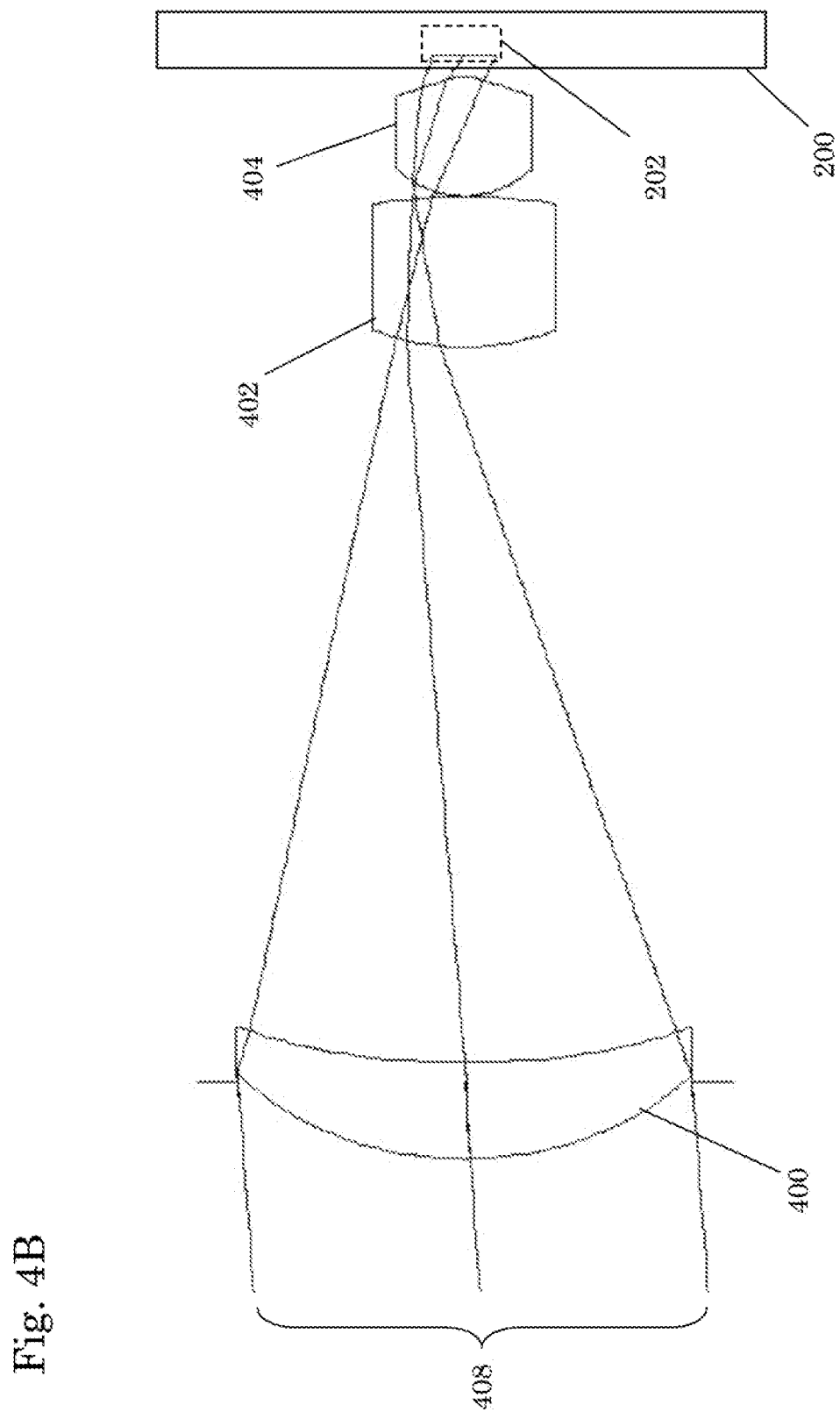

FIGS. 4A and 4B illustrate another exemplary approach to the design of the optical layer of exemplary optically enhanced PV modules according to the present invention. In this exemplary design the optical layer of each optically enhanced PV module includes a close-packed array of Keplerian telescope elements and an array of pupil elements 404. Each Keplerian telescope element is designed and arranged to couple incident radiation into corresponding pupil element 404 such that the pupil element relays the coupled incident radiation into corresponding PV element 202" in absorber layer 200.

One potential advantage of this exemplary Keplerian telescope design is that it provides the resulting PV module with a passive solar tracking method that may efficiently accept incident radiation over a predetermined range of angles. Depending on the specific design of the close-packed array of Keplerian telescope elements, this predetermined range of angles may be as large as about +/−14°.

In the exemplary embodiment of FIGS. 4A and 4B, a single Keplerian telescope element of the optic layer is illustrated. This Keplerian telescope element includes objective lens 400 and eyepiece lens 402. These two sub-elements are desirably formed in two optic sub-layers that include arrays of these sub-elements to form the desired close-packed array of Keplerian telescope elements. Each Keplerian telescope element is desirably designed and arranged to substantially couple a portion of the incident radiation into corresponding pupil element 404. The couple portion of the radiation being that which is: 1) incident on its objective surface; 2) within the predetermined absorption wavelength band; and 3) within the predetermined field of view of the exemplary PV module. Pupil element 404 is designed and arranged to substantially relay this coupled radiation into corresponding PV element 202".

These optic sub-layers may be desirably designed to be snapped together to help insure proper registration of the individual objective lenses and eyepiece lenses in the assembled optic layer. This optic layer may also be desirably designed to be snapped onto absorber layer 200.

In the exemplary embodiment of FIGS. 4A and 4B, objective lens 400 and eyepiece lens 402 may desirably be formed of a plastic material having a high Abbe number similar to that of crown glass, such as PMMA, or a plastic material having a moderately low Abbe number similar to that of flint glass, such as polycarbonate, depending on the desired chromatic dispersion properties of the resulting Keplerian telescope element. It is noted that these elements may also be formed of flint glass or crown glass.

In another exemplary embodiment both optical components of each Keplerian telescope elements may be formed of an optical material in which a plastic matrix is loaded with high refractive index nano-particles. In this exemplary embodiment the objective lens and the eyepiece lens may be separate as in the exemplary embodiment of FIGS. 4A and 4B, or they may be monolithically integrated by manipulating the doping of the high refractive index nano-particles within the plastic matrix.

Although it is desirable for the Keplerian telescope elements of exemplary embodiments of the present invention to be closely packed, it may be desirable for each Keplerian telescope element of the optic layer to have a substantially circular cross-section in a plane parallel to the top surface of absorber layer 200. Additionally, it may also be desirable for each PV element of the optic layer to have a substantially circular cross-section in the plane of the top surface of absorber layer 200.

FIGS. 4A and 4B include exemplary ray tracings 406 and 408, respectively, to illustrate how the Keplerian telescope element and pupil element of this exemplary optic layer may couple incident radiation into PV element 202" of absorber layer 200 for two different angles of incidence. Incident beam 406 in FIG. 4A is a collimated beam that is incident on objective lens 400 parallel to the optical axis of the Keplerian telescope element, and incident beam 408 in FIG. 4B is a collimated beam that is incident on objective lens 400 at an angle to the optical axis of the Keplerian telescope element near the maximum desirable angle for the exemplary PV module design of FIGS. 4A and 4B. As illustrated in these figures, the exemplary optical layer is desirably designed to converge both incident beam 406 and incident beam 408 into PV element 202" of absorber layer 200.

Although illustrated and described above with reference to certain specific embodiments, the present invention is nevertheless not intended to be limited to the details shown. Rather, various modifications may be made in the details within the scope and range of equivalents of the claims and without departing from the invention. As illustrated in the various figures of this disclosure, the micro-optical elements of the various embodiments of the present invention may be microlenses; however, it is contemplated that other micro-optical elements, including reflective and diffractive micro-optical elements may be used as well. It is noted that the use of glasses rather than plastic materials having similar optical properties in exemplary embodiments of the present invention may desirably provide for increased durability of the optic layers, but may also undesirably lead to increased weight. A balancing of these considerations may result in different material choices for different applications. It is also contemplated that exemplary embodiments of the present invention may include exemplary PV solar energy systems in which the outer optic layer (hereinabove labeled as the "translatable optic layer") may be fixedly coupled to the panel base and, thus, the translation stage in these embodiments would cause the inner optic layer (hereinabove labeled as the "fixed optic layer") and the absorber layer to translate relative to the outer optic layer.

What is claimed:

1. A microsystem enabled photovoltaic (MEPV) module, the MEPV module comprising:
    an absorber layer including an array of photovoltaic (PV) elements and a top surface;
    a fixed optic layer coupled to the top surface of the absorber layer, the fixed optic layer including an array of spaced apart quasi-collimating (QC) micro-optical elements, each QC micro-optical element designed and arranged to couple incident radiation from a quasi-telecentric intermediate image into a respective one of the array of PV elements such that the coupled radiation is quasi-collimated;
    a translatable optic layer including an array of spaced apart focusing micro-optical elements, each focusing micro-optical element:
        aligned to a respective one of the array of QC micro-optical elements; and
        being designed to produce the quasi-telecentric intermediate image from substantially collimated radiation incident within a predetermined field of view; and
    a translation stage coupled between the fixed optic layer and the translatable optic layer; and
    a motion processor electrically coupled to the translation stage to control motion of the translatable optic layer relative to the fixed optic layer.

2. The MEPV module of claim 1, wherein:
    each PV element of the absorber layer includes a PV cell stack, each PV cell of the stack being substantially centered on a line normal to the top surface of the absorber layer,
    a top PV cell of the stack has a first absorption wavelength peak; and
    a bottom PV cell of the stack has a second absorption wavelength peak, the second absorption wavelength peak being longer than the first absorption wavelength peak.

3. The MEPV module of claim 2, wherein at least one of:
    the top PV cell of the stack includes:
    a top Fabry-Perot cavity having a first resonant wavelength approximately equal to the first absorption wavelength peak of the top PV cell; and
    a top absorber layer formed within the top Fabry-Perot cavity; or
    the bottom PV cell of the stack includes:
    a bottom Fabry-Perot cavity having a first resonant wavelength approximately equal to the second absorption wavelength peak of the bottom PV cell; and
    a bottom absorber layer formed within the bottom Fabry-Perot cavity.

4. The MEPV module of claim 2, wherein:
    the top PV cell of the stack includes a first absorber layer formed of a type IV semiconductor material or a type III/V semiconductor material; and the bottom PV cell of the stack includes a second absorber layer formed of one of a type IV semiconductor material, a type III/V semiconductor material, or a type II/VI semiconductor material.

5. The MEPV module of claim 2, wherein the bottom PV cell of the stack is a thermal photovoltaic cell.

6. The MEPV module of claim 2, wherein:
the absorber layer further includes a wide bandwidth antireflection (AR) coating formed on the top surface of the absorber layer, and
the wide bandwidth AR coating:
is designed to function for radiation coupled into the absorber layer from the fixed optic layer having a quasi-collimated optical field; and
has a design bandwidth including the first absorption wavelength peak of the array of top PV cells and the second absorption wavelength peak of the array of bottom PV cells.

7. The MEPV module of claim 1, wherein the fixed optic layer is formed of one of crown glass or a plastic material having a high Abbe number similar to that of crown glass.

8. The MEPV module of claim 1, wherein the fixed optic layer and the absorber layer are designed to mechanically snap together.

9. The MEPV module of claim 1, wherein:
the fixed optic layer is formed on the top surface of the absorber layer; and
each QC micro-optic element is an immersion micro-optical lens.

10. The MEPV module of claim 1, wherein the predetermined field of view is up to about +/−14°.

11. The MEPV module of claim 1, wherein each focusing micro-optical element of the translatable optic layer includes:
a first micro-optic sub-element formed of one of crown glass or a first plastic material having a high Abbe number similar to that of crown glass; and
a second micro-optic sub-element located between the first micro-optic sub-element and the fixed optic layer, the second micro-optic sub-element being formed of one of flint glass or a second plastic material having a moderately low Abbe number similar to that of flint glass.

12. The MEPV module of claim 1, wherein translation stage is one of:
a piezoelectric motion stage;
a microelectromechanical system (MEMS) driven motion stage;
an electrostrictive motion stage;
a magnetostrictive motion stage; or
an inchworm drive motion stage.

13. The MEPV module of claim 1, wherein:
at least one beam alignment sensor is positioned in place of the at least one of the QC micro-optical elements of the fixed optic layer; and
the motion processor controls the motion of the translatable optic layer relative to the fixed optic layer based on electrical signals from the at least one beam alignment sensor.

14. The MEPV module of claim 1, wherein:
at least one PV element of the absorber layer is electrically coupled to the motion processor, and
the motion processor controls the motion of the translatable optic layer relative to the fixed optic layer to substantially maximize electrical power received from the at least one PV element.

15. A photovoltaic (PV) solar energy system comprising:
a system mount including:
at least one right-ascension tilt stage; and
at least one tilt stage coarse controller coupled to the at least one right-ascension tilt stage to provide coarse right-ascension tracking of the sun each day;
a panel base coupled to each right-ascension tilt stage; and
at least one optically enhanced PV module coupled to each panel base, each optically enhanced PV module including:
an absorber layer having a top surface and a predetermined absorption wavelength band, and including an array of PV elements; and
an optic layer coupled to the absorber layer, the optic layer including a close-packed array of micro-optical elements having a one-to-one correspondence to the array of PV elements of the absorber layer, each micro-optical element:
having an objective surface and an optical axis substantially normal to the top surface of the absorber layer; and
being designed and arranged to couple a portion of radiation that is incident on the objective surface into the corresponding PV element, the coupled portion of the incident radiation:
having a wavelength within the predetermined absorption wavelength band; and
propagating in a direction within a predetermined field of view of the micro-optical element, wherein:
the optic layer of each said optically enhanced PV module comprises a fixed optic layer coupled to the top surface of the absorber layer, a translatable optic layer including an array of focusing micro-optical elements, and a translation stage coupled between the fixed optic layer and the translatable optic layer and arranged to controllably produce relative motion between said fixed and translatable optic layers;
each said fixed optic layer includes an array of quasi-collimating (QC) micro-optical elements, each said QC micro-optical element being designed and arranged to couple incident radiation from a quasi-telecentric intermediate image into one of the array of PV elements such that the coupled radiation is quasi-collimated; and
within each translatable optic layer, each of the focusing micro-optical elements corresponds to one of the array of QC micro-optical elements and is designed to produce the quasi-telecentric intermediate image from substantially collimated radiation incident within a predetermined field of view.

16. The PV solar energy system of claim 15, wherein the at least one tilt stage coarse controller includes at least one of: a clock drive; a stepper motor; or a manual adjustment control.

17. The PV solar energy system of claim 15, wherein:
the system mount further includes at least one declination tilt stage coupled in series with the at least one right-ascension tilt stage such that each panel base is coupled to one declination tilt stage and one right-ascension tilt stage; and
the at least one tilt stage coarse controller is further coupled to the at least one declination tilt stage to provide coarse declination tracking of the sun between days.

18. The PV solar energy system of claim 15, wherein:
each PV element of the absorber layer includes a PV cell stack, each PV cell of the stack being substantially centered on a line normal to the top surface of the absorber layer,
a top PV cell of the stack has a first absorption wavelength peak;

a bottom PV cell of the stack has a second absorption wavelength peak, the second absorption wavelength peak being longer than the first absorption wavelength peak; and the first absorption wavelength peak and the second absorption wavelength peak are within the predetermined absorption wavelength band.

19. The PV solar energy system of claim 18, wherein:

the absorber layer further includes a wide bandwidth antireflection (AR) coating formed on the top surface of the absorber layer, and the wide bandwidth AR coating:

is designed to function for radiation coupled into the absorber layer from the fixed optic layer having a quasi-collimated optical field; and has a design bandwidth including the first absorption wavelength peak of the array of top PV cells and the second absorption wavelength peak of the array of bottom PV cells.

20. The PV solar energy system of claim 15, wherein:

the fixed optic layer is formed on the top surface of the absorber layer, and each QC micro-optic element is an immersion micro-optic element.

21. The PV solar energy system of claim 15, wherein each focusing micro-optical element of the translatable optic layer of each MEPV module includes:

a first micro-optic sub-element formed of one of crown glass or a first plastic material having a high Abbe number similar to that of crown glass; and a second micro-optic sub-element located between the first micro-optic sub-element and the fixed optic layer, the second micro-optic sub-element being formed of a one of flint glass or a second plastic material having a moderately low Abbe number similar to that of flint glass.

22. The PV solar energy system of claim 15, wherein the translation stage of each MEPV module is one of:

a piezoelectric motion stage;

a microelectromechanical system (MEMS) driven motion stage;

an electrostrictive motion stage;

a magnetostrictive motion stage; or an inchworm drive motion stage.

23. The PV solar energy system of claim 15, wherein:

the optical layer of each optically enhanced PV module includes a close-packed array of Keplerian telescope elements and an array of pupil elements;

each Keplerian telescope element:

having an objective surface;

corresponding to one of the array of pupil elements; and being designed and arranged to substantially couple radiation that is incident on the objective surface, within the predetermined absorption wavelength band, and within the predetermined field of view into the corresponding pupil element; and each pupil element:

corresponding to one of the array of pupil elements; and being designed and arranged to substantially relay radiation that is coupled into the pupil element from the corresponding Keplerian telescope element and within the predetermined absorption wavelength band into the corresponding PV element.

24. The PV solar energy system of claim 15, wherein the predetermined field of view is up to about +/−14°.

* * * * *